United States Patent [19]

Gehrt et al.

[11] Patent Number: 5,077,538
[45] Date of Patent: Dec. 31, 1991

[54] FM DEMODULATOR WITH CARRIER SHIFT COMPENSATION

[75] Inventors: Holger Gehrt, Rosengarten; Günter Hildebrandt, Hamburg, Karl-Heinz Rehfeldt, Ellerbek, all of Fed. Rep. of Germany

[73] Assignee: U.S. Philips Corporation, New York, N.Y.

[21] Appl. No.: 662,385

[22] Filed: Feb. 26, 1991

Related U.S. Application Data

[63] Continuation of Ser. No. 410,393, Sep. 20, 1989, abandoned.

[30] Foreign Application Priority Data

Oct. 7, 1988 [DE] Fed. Rep. of Germany ....... 3834118

[51] Int. Cl.$^5$ .............................................. H03D 3/06
[52] U.S. Cl. .................................... 329/319; 329/336; 360/30; 455/214
[58] Field of Search ............... 329/318, 319, 336, 337; 455/214; 360/30

[56] References Cited

U.S. PATENT DOCUMENTS

| | | | |
|---|---|---|---|
| 4,451,792 | 5/1984 | Gay | 329/319 |
| 4,789,976 | 12/1988 | Fujishima | 329/318 |
| 4,851,785 | 7/1989 | Gehrt et al. | 329/336 |

FOREIGN PATENT DOCUMENTS

| | | |
|---|---|---|
| 3702854 | 8/1988 | Fed. Rep. of Germany . |
| 3702855 | 8/1988 | Fed. Rep. of Germany . |
| 3702856 | 8/1988 | Fed. Rep. of Germany . |
| 3706319 | 9/1988 | Fed. Rep. of Germany . |
| 54-34746 | 3/1979 | Japan ................................... 329/337 |
| 54-34747 | 3/1979 | Japan ................................... 329/337 |

*Primary Examiner*—Siegfried H. Grimm
*Attorney, Agent, or Firm*—Leroy Eason

[57] ABSTRACT

A circuit arrangement which includes an FM demodulator having a delay circuit which subjects the received FM signal to a preset time delay and a signal combining circuit which combines the delayed and undelayed FM signal to derive a combined signal the mean value of which is proportional to the frequency of the FM signal. A low pass filter derives the demodulated signal from such combined signal. The proportionality factor is determined by the preset time delay, which is controllable by a control signal supplied to the delay circuit by a datum level detector which detects a selected datum level of the demodulated signal; for example, the lowest level of such signal. By controlling the time delay in accordance with such datum level, the datum level detector thereby stabilizes the maximum amplitude of the demodulated signal relative to the datum level thereof despite variations in the maximum frequency swing of the received FM signal.

3 Claims, 3 Drawing Sheets

FM DEMODULATOR WITH CARRIER SHIFT COMPENSATION

This is a continuation of application Ser. No. 07/410,393, filed Sept. 20, 1989, and now abandoned.

BACKGROUND OF THE INVENTION

The invention relates to a circuit arrangement for demodulating a frequency-modulated received signal into a demodulated output signal.

Such a circuit arrangement is disclosed in, for example, the German Offenlegungsschriften 3702855. It comprises a delay arrangement to which the received FM signal is applied and which delays it by a predetermined time delay, as well as an exclusive-OR circuit or a multiplier which combine the delayed and undelayed signals to derive demodulated signal. This demodulated signal is in the form of a pulsewidth modulated voltage, whose mean value can be recovered, free from harmonics, by a subsequent low-pass filter. The width of the pulses of the signal at the output of the exclusive-OR member and consequently the mean value at the output of the low-pass filter are linearly related to the frequency of the frequency-modulated signal. Changes in the frequency of the frequency-modulated signal, more specifically its modulation, consequently change the mean value and as a result thereof the signal supplied from the output of the low-pass filter, so that the frequency modulation is directly converted into an analog signal (for example an analog voltage).

For the case in which the carrier frequency of the frequency-modulated signal assumes a fixed, stable value, the signal at the output of the low-pass filter correctly represents the value of the frequency modulation of the carrier frequency of the frequency-modulated signal. If, in contrast thereto, the carrier frequency fluctuates, these fluctuations are transferred to the mean value and consequently distort the information content transmitted by the frequency-modulated signal. This may happen, for example, when the frequency-modulated signal is read from a record carrier which is mechanically moved relative to a reading device.

The invention has for its object to implement a circuit arrangement of the type defined in the opening paragraph such that fluctuations of the carrier frequency do not have any influence on the mean value of the demodulated signal and consequently on the information content to be recovered from the frequency-modulated signal.

SUMMARY OF THE INVENTION

According to the invention, this object is achieved by providing a datum level detector for detecting a datum level in the demodulated signal and setting the time delay so as to control the slope of the demodulation characteristic, it thereby being possible to apply the detected datum level to the delay circuit to control the amplitude of the demodulated signal.

The invention utilizes the direct relation which exists between the mean value of the signal at the output of the frequency demodulator or the associated low-pass filter and the frequency of the frequency-modulated signal. The slope of this demodulation characteristic determines both the amplitude swing of the mean value, corresponding to a predetermined frequency swing of the frequency-modulated signal, and the assigning of a predetermined frequency in the overall frequency spectrum of the frequency-modulated signal to a predetermined mean value. At a predetermined slope of the demodulation characteristic, the amplitude swing of the mean value is directly correlated with the mean value for a given frequency in the frequency-modulated signal. If this frequency corresponds to a reference level in the information content to be transferred, it is possible to determine from the detection of this reference level in the demodulated signal—more specifically in its mean value—the deviation of the associated frequency of the frequency-modulated signal from its target value and consequently the deviation of the amplitude swing of the mean value from its target value. In accordance with the invention, the slope of the demodulation characteristic is now set via such a setting device, that in spite of the frequency deviation the target value of the amplitude swing of the mean value is obtained. Because of the described direct correlation, the detected reference level is directly applied to the setting device as a setting value for this control of the amplitude of the demodulated signal.

Thus the invention enables a very simple control of both the reference level and the amplitude swing to the desired target values in a single control circuit. This control is of a simple structure, has a high control rate and a high stability, that is to say it has little tendency to self-oscillation.

In a preferred embodiment of the circuit arrangement according to the invention, provided with a delay arrangement to which the received FM signal is applied and which delays it by a preset time delay, and also a signal combining stage, more specifically an exclusive-OR member or a multiplier, which combines the delayed and undelayed signals to derive a demodulated signal, the preset time delay being adjustable. Such an arrangement has a linear demodulation characteristic whose slope, that is to say its inclination, can be changed in a simple and effective manner by setting the time delay. Examples of the structure of such a delay circuit are known from the German Offenlegungsschriften 3702854, 3702855 and 3706319 and will not be described in further detail here. The possibilities or circuits, respectively, described therein for setting the time delay can directly be used as a time delay setting circuit for the present invention.

In addition, the circuit arrangement according to the invention can be connected in a particularly advantageous manner to a frequency swing detector for detecting whether the frequency of the FM signal exceeds a predetermined frequency swing range, the frequency swing detector producing an error indication signal when the phase shift between the undelayed signal and the delayed signal exceeds a limit value corresponding to the predetermined frequency swing range.

A frequency swing detector of such a type is preferably used in the evaluation of a frequency-modulated signal read from a mechanically moved record carrier. Defects in this type of record carrier, such as, for example, manufacturing errors or damages, which cause the frequency-modulated signal to fail to appear for a given time interval, become apparent from the fact that the frequency of such signal exceeds a given, presettable, limit value. If such an exceeding of the limit value is detected, subsequent signal processing arrangements controlled by the error indication signal can initiate measures for compensating or by-passing the error.

A particularly significant saving in components and a resultant simplification of the circuit structure can be obtained when the frequency swing detector is of the type described in the German Offenlegungsschriften 3702856 and employs the delay arrangement jointly with the circuit for demodulating the FM signal. In addition thereto the advantage is obtained that together with setting the slope of the demodulation characteristic via a datum level-dependent tracking of the time delay of the delay arrangement also the limit value corresponding to the frequency swing range are readjusted. Should, in contrast thereto, the limit value be permanently preset, independently of the fluctuations of the carrier frequency of the frequency-modulated signal, which fluctuations are to be removed, these fluctuations could in the most disadvantageous case so superpose themselves on the frequency swing associated with the information content, that the frequency swing detector itself would indicate, even if the information content is undisturbed, an error in the FM signal. This might, for example, have disadvantageous results during the start-up of a mechanically moved record carrier. On the other hand, the described implementation of the frequency swing detector renders it possible to recover usable signals during the startup of the record carrier or in its fast mode, for example to control the movement of the record carrier.

BRIEF DESCRIPTION OF THE DRAWING

Embodiments of the invention are shown in the accompanying drawings and will be described in greater detail. In the drawing

DETAILED DESCRIPTION OF THE INVENTION

Figure 1:
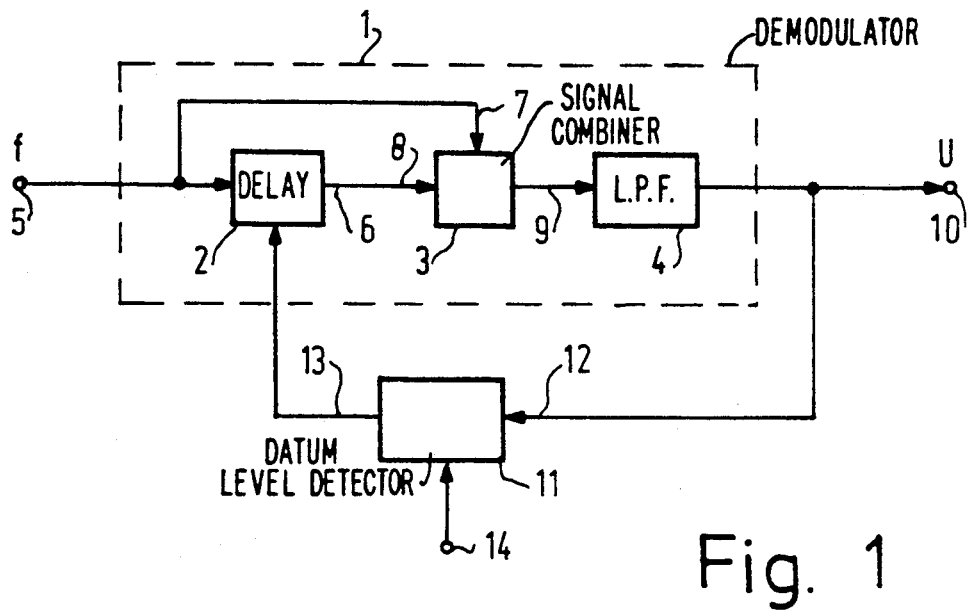
FIGS. 1 to 3 are block circuit diagrams of circuit arrangements according to the invention.

FIG. 1 shows a frequency demodulator 1 which is surrounded by a broken line, and a delay circuit 2, a signal combining circuit 3 and also a low-pass filter 4. From an input 5 a frequency-modulated amplitude-limited input signal is applied to the delay circuit 2, which forms therefrom a signal delayed by a preset time delay and supplies it from its output 6.

The signal combining circuit 3 which, for example, is constituted by an exclusive-OR gate or a multiplier receives the undelayed signal at a first input 7 and the delayed signal at a second input 8. At the output 9 of the signal combining circuit 3 a demodulated signal occurs which has a high voltage level in the time intervals in which the voltage levels of the undelayed and delayed signal deviate from each other, and a low voltage level when they are in agreement, for the case in which the signal combining circuit 3 is an exclusive-OR gate. If instead thereof a multiplier is used, then there appears at the output 9 a combined signal which is at a higher voltage level in the time intervals in which the voltage levels of the undelayed and the delayed signal are in agreement, and otherwise a lower voltage level. Consequently, the combined signal recovered at the output 9 in one case is the inverse of that recovered in the other case.

In the subsequent low-pass filter the higher frequency components of the combined signal received from the output 9 are eliminated, so that a demodulated signal without harmonics is supplied from the output 10 of the low-pass filter 4. This demodulated signal corresponds to the d.c. component, and consequently to the mean value, of the combined signal at the output of the signal combining circuit 3. Thus, the frequency demodulator 1 derives an analog voltage from the frequency-modulated signal applied via its input 5. The value of this analog voltage is proportional to the frequency of the frequency-modulated input signal. The proportionality factor, that is to say the slope of the demodulation characteristic between the frequency at the input and the voltage at the output 10 depends on the time delay produced by the delay circuit 2. The slope of the demodulation characteristic increases with an increasing time delay.

Figure 4:
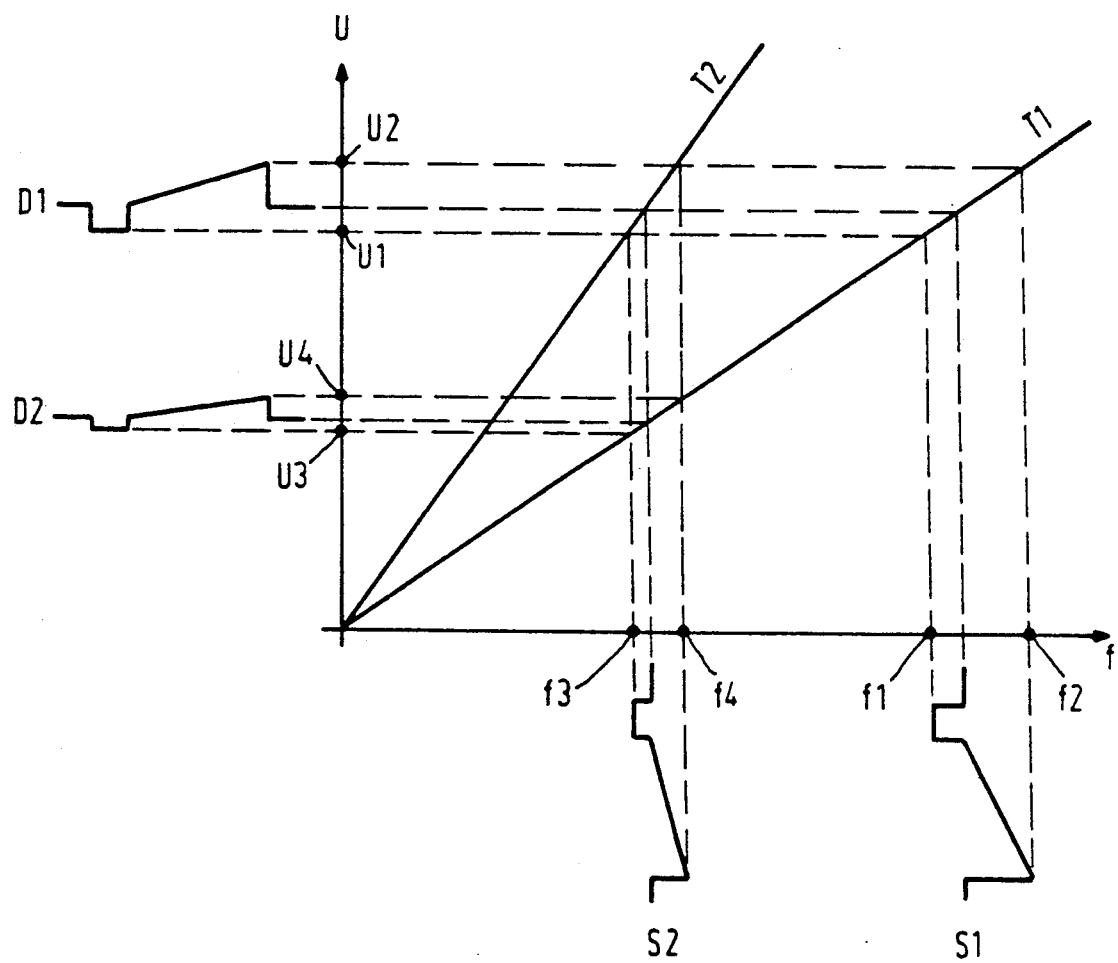
FIG. 4 shows how the invention operates, by means of a demodulator characteristic.

By way of example, FIG. 4 shows such linear demodulation characteristic in a diagram in which the d.c. voltage U at the output 10 is plotted versus the frequency f of the FM signal at the input 5. For a given value of the time delay produced by the delay circuit 2, this demodulation characteristic is as denoted by T1. In a desired condition, the FM input signal has a frequency swing range which is bounded by frequency swing boundaries f1 and f2. In such frequency swing range the frequency f of the FM signal varies, for example, in accordance with a schematically shown modulating signal denoted by S1. The time axis for this schematically shown signal S1 is assumed to extend perpendicularly downwardly in FIG. 4. The modulating signal S1 represents, for example, a video signal in the baseband.

When demodulation is effected in accordance with the demodulation characteristic T1, the frequency demodulator 1 of FIG. 1 supplies from the output 10 a signal U having a voltage variation as denoted by D1 in FIG. 4. The voltage of signal U then varies, in a correlated manner with the frequency f, between voltage swing boundaries U1 and U2. Consequently a preset frequency swing range corresponds to a given voltage swing range.

If the frequency swing range shifts from its desired position between the frequency swing boundaries f1 and f2, for example when there is a delay in the motion of a record carrier from which the first signal is read, to a lower frequency having a smaller swing range between frequency swing boundaries f3 and f4 (actual position), a signal U having a voltage variation designated by D2 is then obtained by the demodulation characteristic T1 from the input FM signal which now varies in accordance with the frequency variation of a modulating signal S2. The voltage variation D2 has a voltage swing range bounded by voltage swing boundaries U3 and U4. It will be obvious that the voltage values and also the voltage swing range are lower in this actual position between the voltage swing boundaries U3 and U4 as compared with the target position.

So as to produce without change a voltage variation D1 even though the FM signal deviates from the target frequency swing, for example varying in accordance with a variation S2, rather than S1 the invention adjusts the slope of the demodulation characteristic. To that end, the arrangement shown in FIG. 1 includes a detector 11 for detecting a datum level in the demodulated signal, that is to say in the voltage of the signal U at the output 10, and for that purpose output 10 is connected to an input 12 of the detector 11. In the voltage variation D1 or D2 the detector 11 detects, for example, the lowest value thereof in correspondence with the voltage swing boundaries U1 or U3, respectively; different datum levels may however alternatively occur and be detected—depending on the frequency variation of the FM input signal—in the demodulated signal. The detector 11 supplies at its output 13 a control signal which corresponds to the selected datum level or is formed in correspondence therewith. This control signal is applied to the frequency demodulator 1.

In the frequency demodulator 1 in FIG. 1 the delay circuit 2 includes a circuit for setting the slope of the demodulation characteristic so as to control the amplitude of the demodulated signal. This setting circuit effects a corresponding change in the time delay of the delay circuit 2. Setting circuits of this type are disclosed in the German Offenlegungsschriften 3702854 and 3706319.

For the frequency demodulator 1, in the demodulation characteristic shown in FIG. 4 increasing the time delay produces a demodulation characteristic having a variation T2 which is distinguished by a steeper slope. The demodulated signal U, that is to say a voltage in accordance with the variation D1, is then recovered from the FM signal via the demodulation characteristic T2. The voltage swing range consequently will not change even though the frequency swing range is reduced. The amplitude of the signal U at the output 10 is therefore independent of shifts in the frequency of the FM signal.

Figure 2:
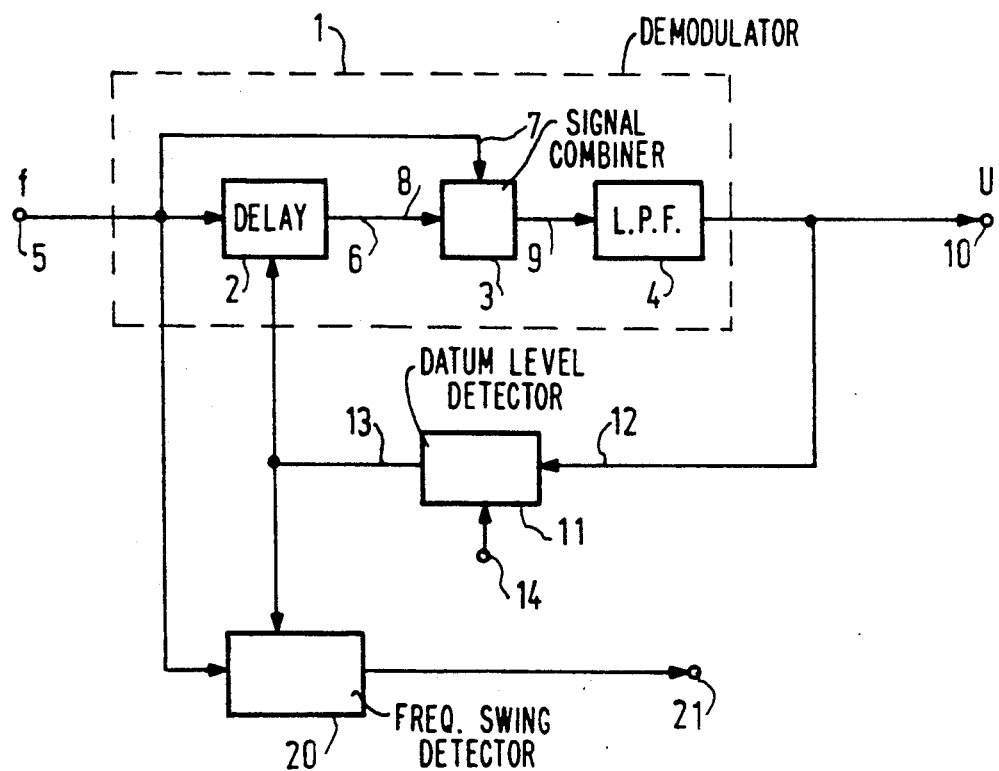

FIG. 2 shows an extension of the circuit arrangement of FIG. 1, in which the components already described in the foregoing are again given the same reference numerals. In addition, the arrangement shown in FIG. 2 includes a frequency swing detector 20 for detecting the frequency swing or variation of the frequency of the FM signal at the input 5. At an output 21, the frequency swing detector 20 supplies an error indication signal when the actual frequency of the FM signal exceeds predetermined limit values. Thus, it is possible to determine, for example, signal drop-outs in the FM signal. To prevent the frequency swing detector 20 from detecting a shift of the frequency of the FM signal from the target position above the limit values as a disappearance of the FM signal, although it is still completely available, the control signal from the setting output 13 of the datum level detector 11 is also applied to the frequency swing detector 20. As such control signal is a direct measure of the actual frequency of the FM signal, limit values can be directly adjusted therewith which are in given frequency intervals below or above the frequency swing range.

Figure 3:
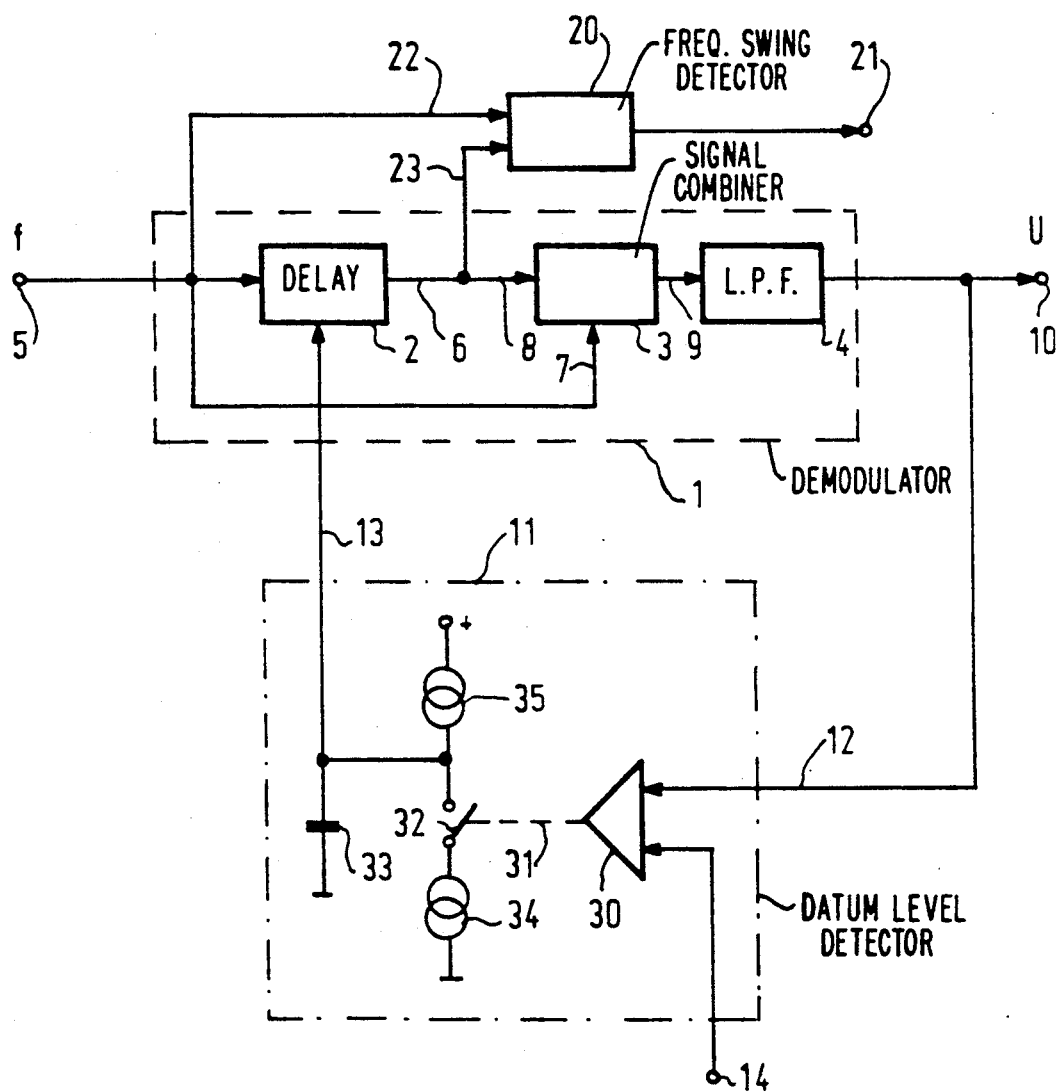

FIG. 3 shows a particularly advantageous particular form of the circuit shown in FIG. 2, in which components corresponding to those of FIG. 2 are again given the same reference numerals. Therein, the frequency swing detector 20 receives the FM signal via a first input 22 and the delayed signal via a second input 23 from the input and output, respectively, of the delay circuit 2. The frequency swing detector 20 may be a circuit as described in the German Offenlegungsschriften 3702856. The first input 22 then corresponds to the control input 10 of that patent, and the second input 23 to the data input 11. In this implementation of the circuit arrangement the delay circuit 2 is not only employed twice, namely both for the frequency demodulator 1 and for the frequency swing detector 20, but by setting the time delay of the delay means 2 an appropriate shift of the limit values of the frequency swing detector 20 is simultaneously effected. The frequency swing detector 20 therefore does not require a separate setting circuit for shifting the limit values. Consequently, the circuit configuration of detector 20 becomes very simple and reliable.

FIG. 3 shows in addition a somewhat detailed example for the implementation of the datum level detector 11. This detector includes a comparator stage 30 in which the voltage U received from the output 10—via the comparator datum level input 12—is compared with a reference voltage—preferably a constant voltage level—applied via a reference signal input 14. If the voltage U falls short of the value of the reference voltage at the input 14, the comparator stage 30 adjusts a switch 32 to the conductive state via a connection 31 and consequently applies a discharging current produced by a current source 34 to a capacitor 33. The capacitor 33 is only discharged by the current source 34 during the negative peaks of the voltage U, but is continuously charged with a small charging current from a further current source 35. When the current rating of the current sources 34, 35 and the capacitance of capacitor 33 are coordinated with each other, the capacitor will always be charged during operation to the voltage U up to the instant at which the negative voltage peak of the demodulated signal occurs at the output 10. In FIG. 4 this is the voltage swing boundary U1 of the voltage variation D1. This voltage U1 is applied via the setting output 13 to the delay circuit 2 for setting the time delay.

If the carrier frequency f of the FM signal decreases, the demodulated signal voltage U first decreases in response thereto and consequently also the value of the lowest voltage peaks thereof. As a result, the time intervals in which the switch 32 is conductive is extended, so that the voltage to which the capacitor 33 is charged decreases. Correspondingly, via the control signal produced at setting output 13, the time delay and consequently the slope of the frequency demodulator 1 is readjusted from the demodulator characteristic T1 to the demodulator characteristic T2, in response to which also the voltage swing of the signal U is readjusted.

The described circuit arrangements are preferably used for the processing of a frequency-modulated signal from a record carrier, more specifically an optically written disc. These circuit arrangements also achieve that when the number of revolutions of the disc is changed, more specifically on start-up or at run out, a demodulated signal which is clamped at a given voltage level and whose amplitude is controlled at the same time is always available in a simple way for further signal processing.

What is claimed is:

1. An FM demodulating circuit arrangement comprising:
    an input for receiving an FM signal to be demodulated;
    delay means coupled to said input for delaying the received FM signal by a preset time delay;
    a signal combining circuit coupled to said input and to said delay means for combining the delayed and undelayed FM signals so as to derive a combined signal having a mean value which is proportional to the frequency of the received FM signal; and
    filter means coupled to said signal combining circuit for filtering the combined signal to derive the mean value thereof, such filtered signal constituting a demodulated signal the amplitude of which corresponds to the frequency of the received FM signal;
    characterized in that:

said demodulating circuit arrangement further comprises a datum level detection circuit coupled to said filter means to receive the demodulated signal, detect a selected datum level thereof, and provide a control signal corresponding to said datum level to said delay means; and the preset time delay of said delay means is adjustable by said control signal, thereby adjusting the proportionality factor between the frequency swing of the FM signal and the amplitude of the demodulated signal, so as to maintain a substantially constant value of said datum level of the demodulated signal;

whereby the maximum amplitude of the demodulated signal is stabilized relative to said datum level thereof despite variations in the maximum frequency swing of the FM signal.

2. An FM demodulating circuit arrangement as claimed in claim 1, wherein said selected datum level of the demodulated signal is the minimum voltage level of such signal.

3. An FM demodulating circuit arrangement as claimed in claim 1, further comprising a frequency swing detection circuit coupled to the input of said circuit arrangement and to said delay means for detecting whether the phase shift between the delayed FM signal and the received FM signal exceeds a limit value corresponding to a predetermined limiting frequency swing of the received FM signal, said limit value being determined by said preset time delay; whereby adjustment of said preset time delay by the control signal from said datum level detection circuit also serves to adjust said limit value.

* * * * *